United States Patent
Lauer et al.

(10) Patent No.: US 9,671,476 B2
(45) Date of Patent: Jun. 6, 2017

(54) APPLICATION OF A MULTICHANNEL COIL FOR HAND IMAGING

(71) Applicants: Lars Lauer, Neunkirchen (DE); Dominik Paul, Bubenreuth (DE); Götz Welsch, Marloffstein (DE)

(72) Inventors: Lars Lauer, Neunkirchen (DE); Dominik Paul, Bubenreuth (DE); Götz Welsch, Marloffstein (DE)

(73) Assignee: Siemens Aktiengesellschaft, München (DE)

( * ) Notice: Subject to any disclaimer, the term of this patent is extended or adjusted under 35 U.S.C. 154(b) by 642 days.

(21) Appl. No.: 14/154,895

(22) Filed: Jan. 14, 2014

(65) Prior Publication Data
US 2014/0197837 A1   Jul. 17, 2014

(30) Foreign Application Priority Data
Jan. 15, 2013   (DE) .................. 10 2013 200 481

(51) Int. Cl.
*G01V 3/00*   (2006.01)
*G01R 33/34*   (2006.01)
*G01R 33/3415*   (2006.01)

(52) U.S. Cl.
CPC .......... *G01R 33/34* (2013.01); *G01R 33/3415* (2013.01)

(58) Field of Classification Search
CPC .. G01R 33/4828; G01R 33/50; G01R 33/543; G01R 33/5608; A61B 5/055
USPC .......................................................... 399/318
See application file for complete search history.

(56) References Cited

U.S. PATENT DOCUMENTS

| 5,400,787 | A | 3/1995 | Marandos | |
| 6,906,518 | B2 * | 6/2005 | Leussler | G01R 33/3628 324/318 |
| 6,943,551 | B2 | 9/2005 | Eberler et al. | |
| 9,547,055 | B2 * | 1/2017 | Biber | G01R 33/36 |
| 2007/0152668 | A1 * | 7/2007 | Zhang | G01R 33/34007 324/318 |
| 2009/0315562 | A1 * | 12/2009 | Bulumulla | G01R 33/3415 324/318 |
| 2013/0211241 | A1 * | 8/2013 | Lauer | A61B 5/055 600/422 |

FOREIGN PATENT DOCUMENTS

DE   10314215      11/2006
DE   102012201944 A1   8/2013

OTHER PUBLICATIONS

German Office Action dated Sep. 6, 2013 for corresponding German Patent Application No. 10 2013 200 481.8 with English translation.

\* cited by examiner

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A method and a local coil for a magnetic resonance imaging (MRI) system are provided. The local coil includes a hand coil having a plurality of rings, each made of a plurality of coil elements.

20 Claims, 4 Drawing Sheets

US 9,671,476 B2

APPLICATION OF A MULTICHANNEL COIL FOR HAND IMAGING

CROSS-REFERENCE TO RELATED APPLICATIONS

This application claims the benefit of DE 10 2013 200 481.8, filed on Jan. 15, 2013, which is hereby incorporated by reference in its entirety.

TECHNICAL FIELD

The present embodiments relate to the technical field of magnetic resonance imaging (MRI), and particularly to a local coil and its method of use.

BACKGROUND

Magnetic resonance imaging scanners (MRIs) for examining objects or patients by magnetic resonance imaging are known from DE10314215B4, for example.

SUMMARY

The scope of the present invention is defined solely by the appended claims and is not affected to any degree by the statements within this summary.

The present embodiments may obviate one or more of the drawbacks or limitations in the related art. For example, a local coil and a method for MRI imaging of a hand are optimized.

The scope of the present invention is defined solely by the appended claims and is not affected to any degree by the statements within this summary. The present embodiments may obviate one or more of the drawbacks or limitations in the related art.

DETAILED DESCRIPTION

Figure 4:
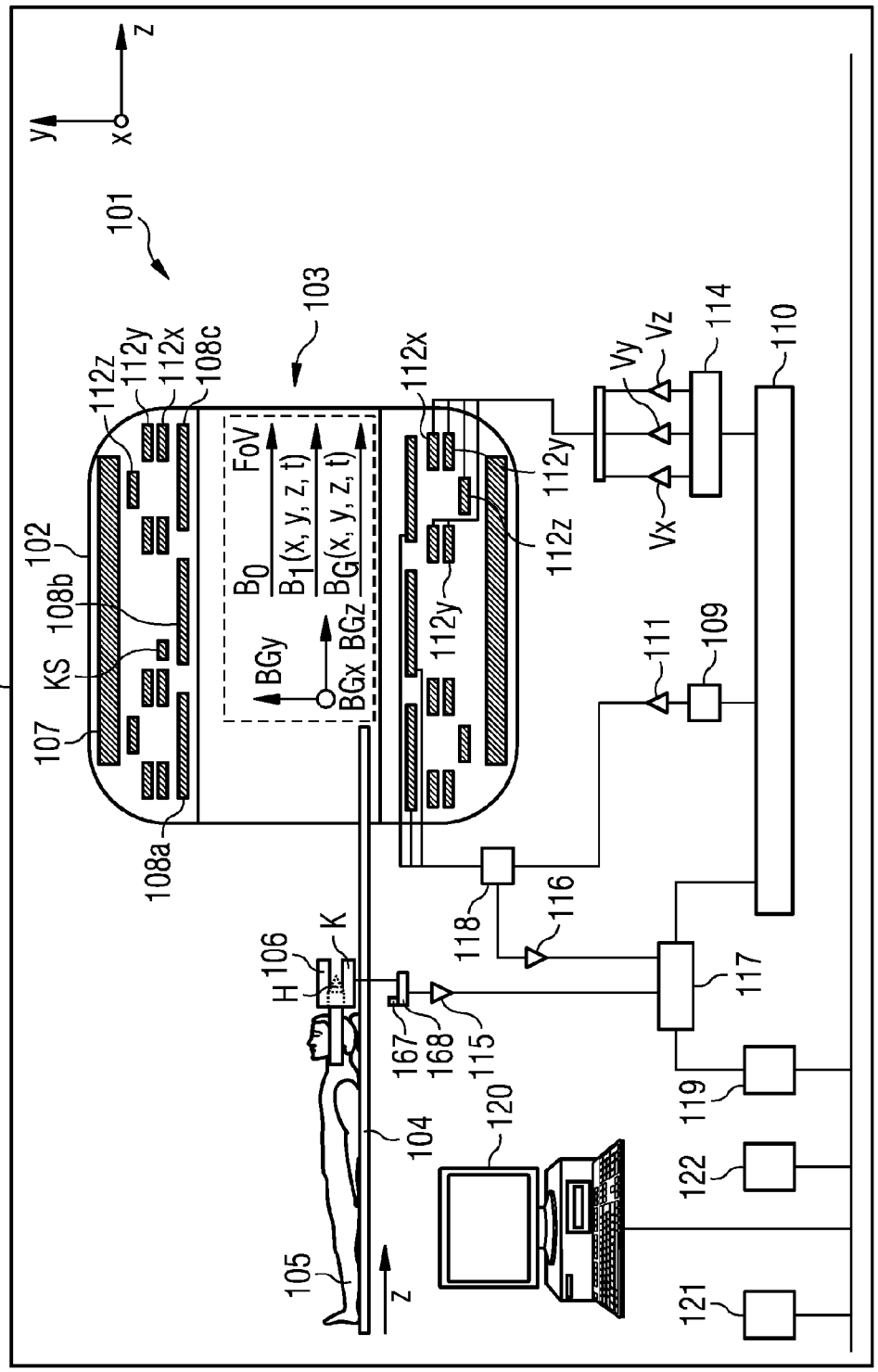
FIG. 4 depicts a schematic of one embodiment of an MRI system.

FIG. 4 shows one embodiment of a magnetic resonance imaging (MRI) scanner 101 (e.g., situated in a shielded room or Faraday cage F) having a whole body coil 102 with, for example, a tubular space 103 in which a patient couch 104 and an examination object or body 105 (e.g., of a patient; with or without a local coil arrangement 106) may be displaced in the direction of the arrow z in order to generate recordings (e.g., of a hand H lying on a cushion K) of the body 105 by an imaging method. In some embodiments, a local coil arrangement 106 is arranged on the patient. Using the local coil arrangement, in a local region (e.g., field of view (FoV)) of the MRI 101, recordings of a portion of the body 105 in the FOV may be generated. Signals of the local coil arrangement 106 may be evaluated (e.g., converted into images, stored or displayed) by an evaluation device (e.g., including elements 168, 115, 117, 119, 120, 121, etc.) of the MRI 101 that may be connected to the local coil arrangement 106 by coaxial cables or by radio link 167, etc.

In order to use an MRI scanner 101 to examine an examination object or body 105 (e.g., a patient) by magnetic resonance imaging, different magnetic fields, which are precisely matched to one another in terms of temporal and spatial characteristics, are radiated onto the body 105. In some embodiments, a strong magnet (e.g., a cryomagnet 107) in a measurement cabin with an opening 103 (e.g., a tunnel-shaped opening) generates a strong static main magnetic field B0 (e.g., having a strength of 0.2-3 Tesla or more). While supported by a patient couch 104, the body 105 may be driven into a region of the main magnetic field B0 that is approximately homogeneous in the observation region or FoV. The nuclear spins of atomic nuclei of the body 105 are excited by magnetic radiofrequency excitation pulses B1 (x, y, z, t) that are radiated in by a radiofrequency antenna and/or a local coil arrangement, which is depicted in a simplified manner as a body coil 108 (e.g., a multi-part body coil 108a, 108b, 108c). By way of example, radiofrequency excitation pulses are generated by a pulse generation unit 109 that is controlled by a pulse sequence control unit 110. After amplification by a radiofrequency amplifier 111, the pulses are conducted to the radiofrequency antenna 108. The radiofrequency system shown is merely indicated schematically. In a magnetic resonance imaging scanner 101, more than one pulse generation unit 109, more than one radiofrequency amplifier 111, and several radiofrequency antennas 108a, 108b, 108c may be used.

In some embodiments, the magnetic resonance imaging scanner 101 also includes gradient coils 112x, 112y, 112z, by which magnetic gradient fields BG (x, y, z, t) are radiated in during a measurement for selective slice excitation and for spatial encoding of the measurement signal. The gradient coils 112x, 112y, 112z are controlled by a gradient coil control unit 114 (e.g., and via amplifiers Vx, Vy, Vz) that, like the pulse generation unit 109, is connected to the pulse sequence control unit 110.

Signals emitted by the excited nuclear spins (e.g., of the atomic nuclei in the examination object) are received by the body coil 108 and/or at least one local coil arrangement 106, amplified by associated radiofrequency preamplifiers 116 and processed further and digitized by a reception unit 117. The recorded measurement data are digitized and stored as complex numbers in a k-space matrix. An associated MRI image may be reconstructed from the k-space matrix filled with values by a multidimensional Fourier transform.

For a coil that may be operated both in transmission mode and in reception mode, such as the body coil 108 or a local coil 106, the correct signal transmission is regulated by an upstream transmission/reception switch 118.

An image processing unit 119 generates an image from the measurement data that is displayed to a user by an operating console 120 and/or stored in a storage unit 121. A central computer unit 122 controls the individual installation components.

In MR imaging, images with a high signal-to-noise ratio (SNR) may be recorded using local coil arrangements (e.g., coils, local coils). These are antenna systems that are attached in the direct vicinity on (anterior) or under (posterior), or at or in the body 105. During an MR measurement, the excited nuclei induce a voltage in the individual antennas of the local coil. The induced voltage is then amplified using a low-noise preamplifier (e.g., LNA, preamp) and transmitted to the reception electronics. In order to improve the signal-to-noise ratio even in the case of high resolution images, use is made of high-field installations (e.g., 1.5-12 Tesla or more). If more individual antennas may be connected to an MR reception system than receivers are available, a switching matrix (e.g., RCCS), for example, is installed between reception antennas and receivers. The matrix routes the currently active reception channels (e.g., the reception channels that currently lie in the field of view of the magnet) to the available receivers. As a result, more coil elements may be connected than receivers are available because, in the case of a whole body cover, only coils that are situated in the FoV or in the homogeneous volume of the magnet may be read.

In some embodiments, an antenna system, which may include one antenna element or an array coil of several antenna elements (e.g., coil elements), may be referred to as a local coil arrangement 106. In some embodiments, these individual antenna elements are embodied as loop antennas (e.g., loops), butterfly coils, flex coils, or saddle coils. In some embodiments, the local coil arrangement includes coil elements, a preamplifier, further electronics (e.g., standing wave traps, etc.), a housing, supports, and may include a cable with plug by which the local coil arrangement is connected to the MRI scanner. A receiver 168 attached to the scanner-side filters and digitizes a signal received from a local coil 106, (e.g., by radio link, etc.), and transmits the data to a digital signal processing device that may derive an image or spectrum from the data obtained by the measurement and make this available to the user (e.g., for the subsequent diagnosis by the user and/or for storing).

Figure 1:
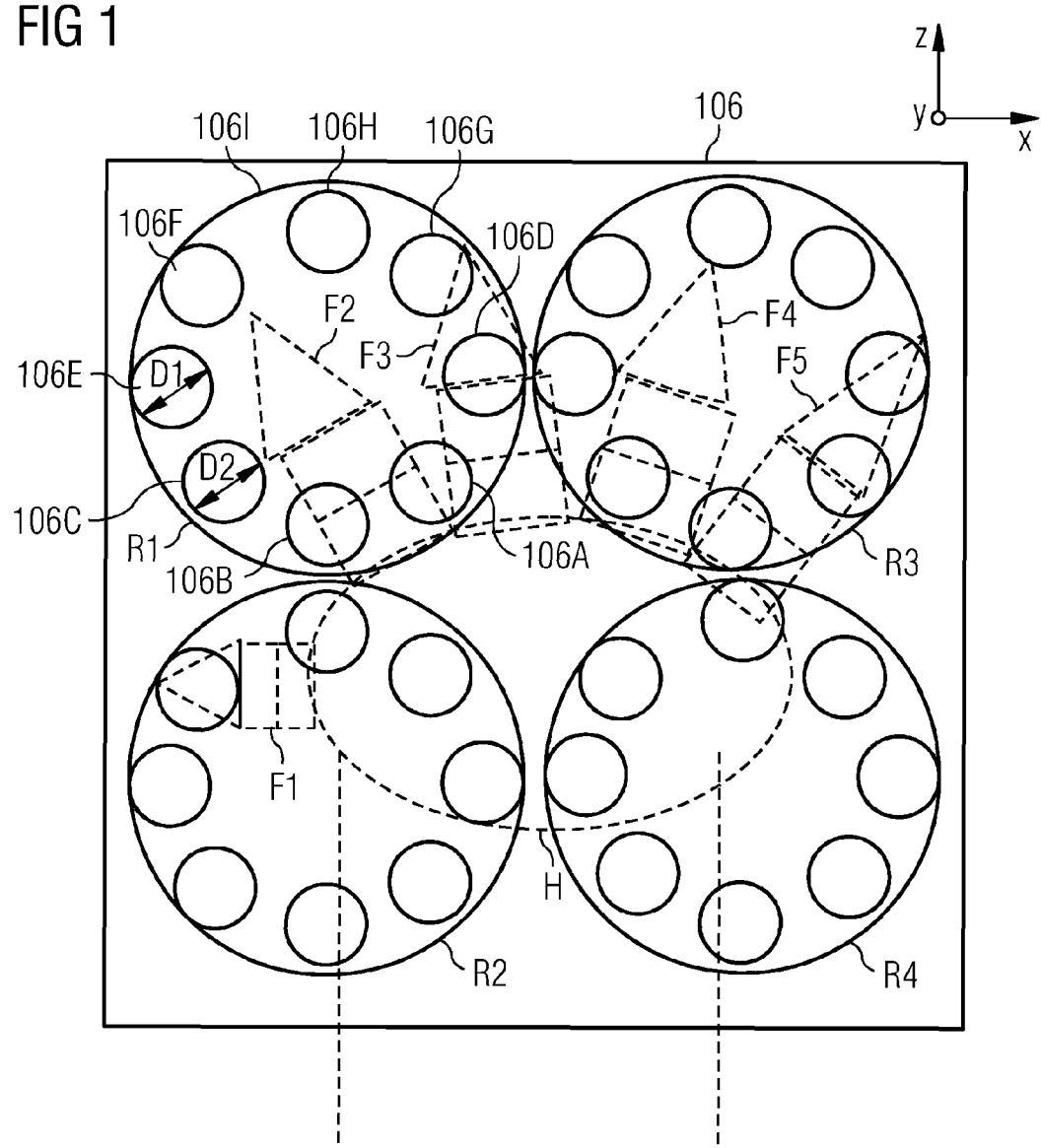
FIG. 1 depicts a top view of one embodiment of a local coil for magnetic resonance imaging (MRI) of a hand with coil elements arranged distributed on rings.

FIG. 1 shows one embodiment of an (MRI) local coil 106, by which MR imaging of a hand H of an examination object 105 may take place.

The hand H, which is displayed in a dashed and simplified manner, has a thumb F1 and four fingers F2, F3, F4, F5. In some embodiments, the local coil 106 has coil elements (e.g., antennas) 106A, 106B, 106C, 106D, 106E, 106F, 106G, 106H, 106I, etc., arranged in four (e.g., alternatively, two, three, or more than four) rings (shown as equally large, round or elliptic rings that surround the positions of the coil elements enclosed therein), such as the coil elements (e.g., antennas) 106A, 106B, 106C, 106D, 106E, 106F, 106G, 106H, 106I, arranged in a ring R1 in terms of position.

In the example of FIG. 1, the diameters D1, D2 of the coil elements are of the same size. Center points of the coil elements 106A, 106B, 106C, 106D, 106E, 106F, 106G, 106H, 106I, arranged in terms of position in a ring R1, are in each case seated on an imagined line of the ring R1. In other embodiments, all coil elements 106A, 106B, 106C, 106D, 106E, 106F, 106G, 106H, 106I, arranged in terms of position in a ring R1, may be within the line of the ring R1.

Figure 2:
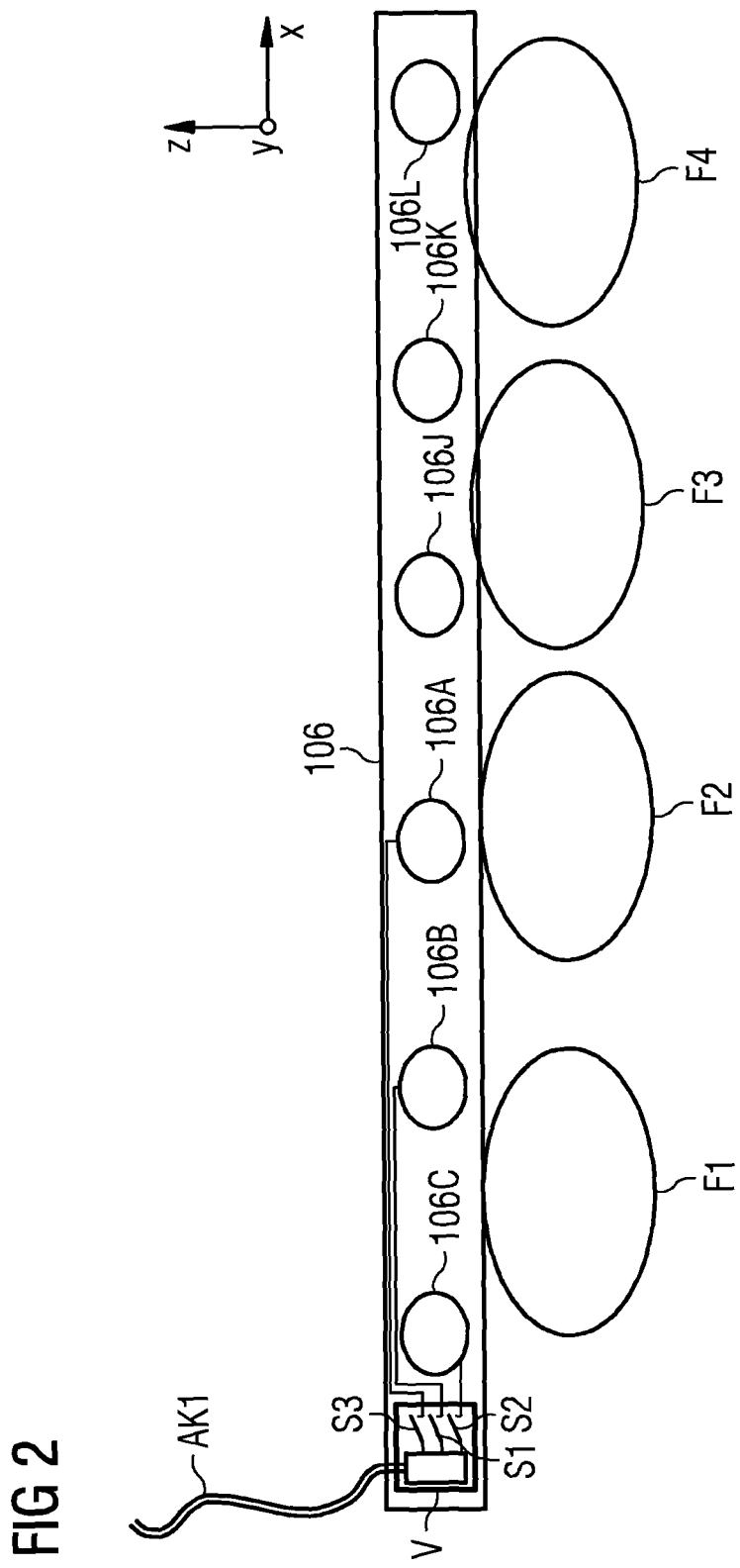
FIG. 2 depicts a cross section of one embodiment of a local coil, such as the local coil shown in FIG. 1.

FIG. 2 shows a cross section of a hand H in a region of the most proximal joints of fingers F2-F5 of the hand. A local coil 106 (e.g., the local coil 106 from FIG. 1) with a connection cable AK1 lies on the hand H. Some of the coil elements (e.g., 106A, 106B, 106C, 106J, 106K, 106L) of the local coil 106 are also shown in this cross section. FIG. 2 also depicts a controller and amplifier V of the local coil 106 and also, as symbols, three of possibly even more switching devices S1, S2, S3 (e.g., implemented as desired), by which individual or a plurality of local-coil coil elements may be switched (e.g., such that the local-coil coil elements may be read out and/or transmit, depending on switching element setting, or not, depending on switching element setting). The local coil 106 may be a multichannel coil with a plurality of coil elements. In each case, for example, all the coil elements in one of the rings of coil elements may be switched together by a switching device such as S1 common to the coil elements.

Figure 3:
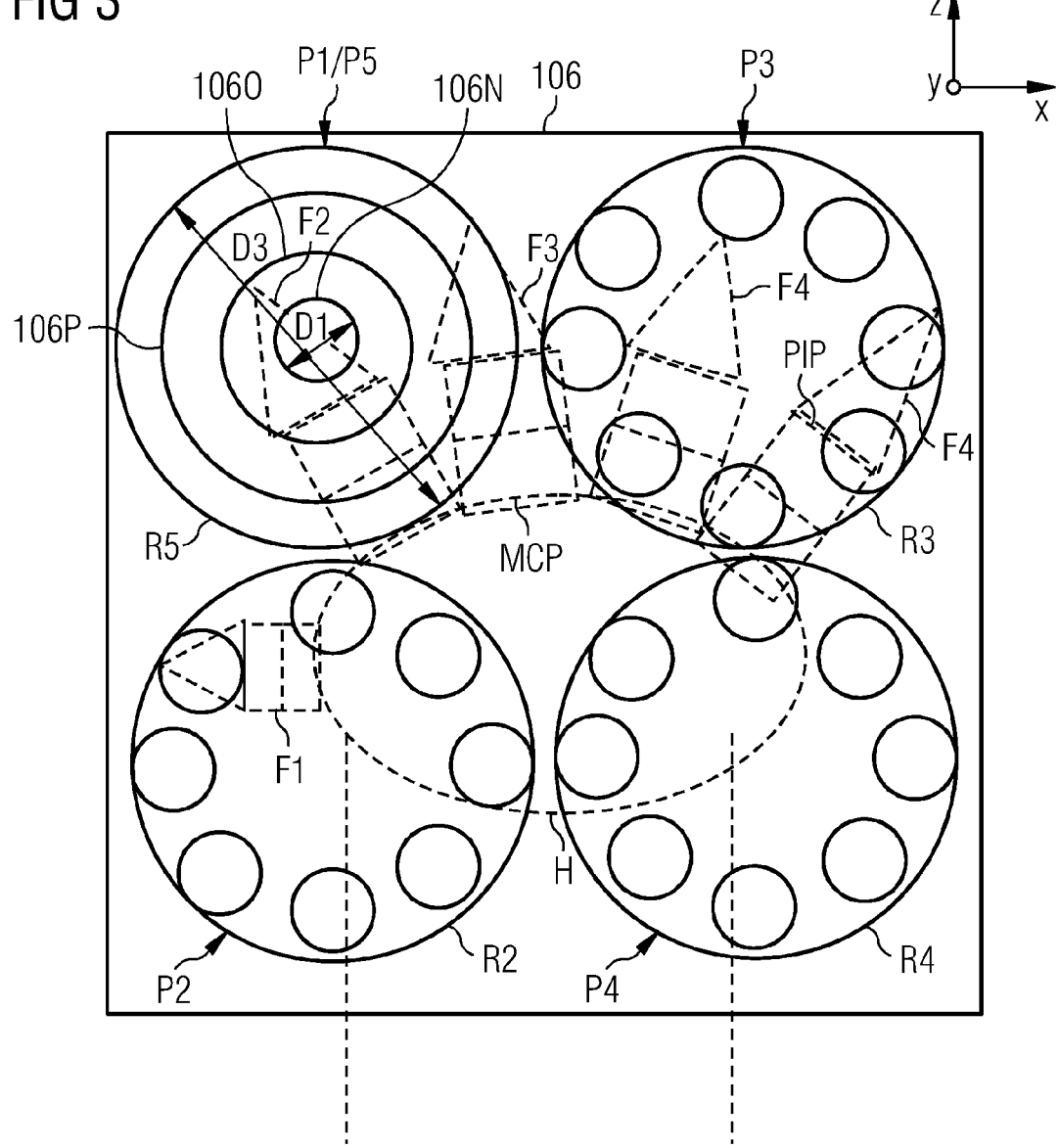
FIG. 3 depicts a top view of a further embodiment of a local coil with coil elements distributed on rings and/or arranged concentrically in rings.

As shown in FIG. 3, the local coil 106 may, according to one or more of the present embodiments, alternatively or additionally have concentrically arranged coil elements on one or more of the rings, such as the coil elements 106N, 106O, 106P (e.g., concentric coil elements with mutually different diameters D1, D3) arranged in the ring R5 (e.g., specifies the position of the coils as a round or elliptic ring).

In the case of at least one imaging MRI examination in the region of the rheumatic arthritis of a hand H, the whole hand H (e.g., both the wrist and smaller finger joints, such as the metacarpophalangeal (MCP) joint and the proximal interphalangeal (PIP) joint), may be recorded simultaneously with high resolution and high SNR and also (e.g., at the same time or using a subsequent further imaging MRI examination) individual regions (e.g., only MCP, only wrist HG, etc.) may be recorded selectively with any orientation.

Previous known coils may have provided substantially good cover for the carpus/wrist, but the coil illumination up to the fingers was rather too low in order to record high-resolution images there. Alternatively, a flex coil may be used, but this may supply a poorer SNR due to the low channel number and the comparatively large coil elements, and at the same time, may receive an interfering signal from the surrounding tissue (e.g., if mounting the hand next to the body). According to, for example, DE102012201944, two loop coils that are affixed above and below the hand by tape may be used. A very high spatial resolution may be obtained with this arrangement, but the arrangement may be spatially tightly restricted (e.g., between one and at most 2-3 MCP joints) and may require complicated patient preparation (e.g., arranging and affixing of the coils), potentially unsuitable for clinical routine.

In some embodiments, a multichannel hand local coil 106 for a hand H (e.g., with more than eight coil elements) is embodied such that:

1.) several (e.g., two or more) rings R1, R2, R3, R4 of coil elements (106A, 106B, 106C, 106D, 106E, 106F, 106G, 106H, 106I, . . . 106N, 106O, . . . ) at different positions of the hand H may be provided; and/or 2.) the whole hand H (e.g., wrist and finger joints or from the wrist to the fingertips) is covered/illuminated in a single recording; and/or 3.) MRI recordings may have a high resolution and, a high SNR due to the size (e.g., the diameter) and/or the density (e.g., the mean distance) of the coil elements (e.g., elements 106A, 106B, 106C, 106D, 106E, 106F, 106G, 106H, 106I, . . . 106N, 106O, . . . ); and/or, 4.) individual regions (e.g., wrist of the hand or MCP joint, etc.) may be recorded individually with high resolution in a selective manner (e.g., by switching off (S1, S2, S3) individual coil rings R1, R2, R3, R4 of coil elements and/or individual elements).

One or more of the present embodiments may include an application of a 16 channel (16 ch) hand coil 106 for correspondingly optimized examinations of the RA, possibly complemented by suitable movement-restricting cushions/padding K for a possibly maximized spatial resolution.

Advantages of the application of the local coil may include, in addition to a high SNR, good reproducibility and hence high validity of the results, particularly if the whole hand H may be imaged, and the risk from incorrect positioning of the local coil 106 over a portion of the hand H is thus reduced.

A further advantage may include that the local coil may be used to detect both the wrist of a hand H and the MCP joints of a hand H in RA examinations. These regions may be of high clinical interest, since in many (e.g., 95%) of the cases, an inflammation activity may be diagnosed (e.g., and possibly, in part, only there).

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance imaging (MRI) system, the local coil comprising:
   a hand coil comprising a plurality of rings,
   wherein each ring of the plurality of rings is made of a plurality of coil elements, and
   wherein the plurality of coil elements of the respective ring do not overlap with the plurality of coil elements of the other rings of the plurality of rings.

2. The local coil of claim 1, wherein the plurality of rings are arranged such that each ring of the plurality of rings is positioned at a different position of a hand during an MRI recording of the hand.

3. The local coil of claim 2, further comprising switching devices for selectively switching at least one ring of the plurality of rings and selectively recording in an imaging fashion at least one individual region of the hand.

4. The local coil of claim 3, further comprising at least one movement-restricting element.

5. The local coil of claim 2, further comprising at least one movement-restricting element.

6. The local coil of claim 1, wherein the plurality of coil elements are arranged such that, during an MRI recording of a hand, the plurality of coil elements permit an MRI recording of the whole hand, cover the length and breadth of the hand, or permit the MRI recording of the whole hand and cover the length and breadth of the hand.

7. The local coil of claim 6, further comprising switching devices for selectively switching at least one ring of the plurality of rings and selectively recording in an imaging fashion at least one individual region of the hand.

8. The local coil of claim 7, further comprising at least one movement-restricting element.

9. The local coil of claim 1, further comprising switching devices each operable for selectively switching at least one ring of the plurality of rings and selectively recording in an imaging fashion at least one individual region of a hand by switching individual rings of the plurality of rings.

10. The local coil of claim 1, wherein the plurality of rings comprises at least three rings or at least four rings, or wherein the hand coil comprises at least 16 channels that are readable in parallel, or
   wherein the plurality of rings comprises at least three rings or at least four rings, and the hand coil comprises at least 16 channels that are readable in parallel.

11. The local coil of claim 1, further comprising at least one movement-restricting element.

12. The local coil of claim 1, wherein the local coil is operable to detect both a wrist of a hand and metacarpophalangeal joints of the hand in an imaging fashion.

13. The local coil of claim 1, wherein the local coil is a multichannel coil comprising at least nine coil elements, at least nine channels that are readable in parallel for signals of the coil elements, or a combination thereof.

14. The local coil of claim 1, wherein the plurality of rings comprises more than two rings of coil elements.

15. The local coil of claim 1, wherein all or some coil elements of the plurality of coil elements in a ring, in some rings, or in all rings of the plurality of rings of the local coil have the same diameter.

16. The local coil of claim 1, wherein all or some coil elements of the plurality of coil elements in one or more rings of the plurality of rings of the local coil have different diameters.

17. The local coil of claim 1, wherein the size, density, or size and density of the plurality of coil elements enable an MRI recording with a high resolution and a high signal-to-noise ratio.

18. The local coil of claim 1, wherein the local coil is 10-20 cm wide and 10-30 cm long, with respect to the maximum spatial extent of the coil elements.

19. The local coil of claim 11, wherein the at least one movement-restricting element comprises a cushion or padding.

20. A method for recording a magnetic resonance imaging (MRI) of a hand, the method comprising:
   MRI recording of the hand, the MRI recording comprising using a multichannel coil comprising a plurality of rings of coil elements, the plurality of rings being arranged such that a ring of coil elements of the plurality of rings of coil elements does not overlap with the other rings of coil elements of the plurality of rings of coil elements and the plurality of rings are positioned at different positions of the hand during the MRI recording of the hand.

* * * * *